(12) United States Patent
Kikunaga

(10) Patent No.: US 11,848,674 B2
(45) Date of Patent: Dec. 19, 2023

(54) COUNTER UNIT

(71) Applicant: OMRON Corporation, Kyoto (JP)

(72) Inventor: Yoshitaka Kikunaga, Kyoto (JP)

(73) Assignee: OMRON Corporation, Kyoto (JP)

( * ) Notice: Subject to any disclaimer, the term of this patent is extended or adjusted under 35 U.S.C. 154(b) by 233 days.

(21) Appl. No.: 17/621,697

(22) PCT Filed: Mar. 2, 2020

(86) PCT No.: PCT/JP2020/008702
§ 371 (c)(1),
(2) Date: Dec. 22, 2021

(87) PCT Pub. No.: WO2021/002051
PCT Pub. Date: Jan. 7, 2021

(65) Prior Publication Data
US 2022/0352894 A1    Nov. 3, 2022

(30) Foreign Application Priority Data
Jul. 2, 2019  (JP) .................................. 2019-123659

(51) Int. Cl.
*H03K 21/02* (2006.01)
*G05B 19/05* (2006.01)

(52) U.S. Cl.
CPC ............. *H03K 21/02* (2013.01); *G05B 19/05* (2013.01); *G05B 2219/15069* (2013.01)

(58) Field of Classification Search
None
See application file for complete search history.

(56) References Cited

U.S. PATENT DOCUMENTS

| 4,771,403 | A | 9/1988 | Maskovyak et al. |
| 11,640,197 | B2 * | 5/2023 | Oba ...................... G06F 1/3287 |
| | | | 713/300 |
| 2015/0180478 | A1 | 6/2015 | Park |

FOREIGN PATENT DOCUMENTS

| JP | H05127711 | 5/1993 |
| JP | H05346809 | 12/1993 |

(Continued)

OTHER PUBLICATIONS

"International Search Report (Form PCT/ISA/210) of PCT/JP2020/008702," dated Apr. 7, 2020, with English translation thereof, pp. 1-4.

(Continued)

*Primary Examiner* — Cassandra F Cox
(74) *Attorney, Agent, or Firm* — JCIPRNET (57) ABSTRACT

The present invention provides a counter unit (10) that supports, in a plurality of output devices, both a case where there is no problem in a state in which common signal terminals or power supply terminals are connected by common wiring, and a case where it is preferable to connect the common signal terminals or the power supply terminals by circuits insulated from each other. The counter unit (10) is provided with a switching unit (15) that performs switching between a non-insulated circuit (16) that connects a plurality of common signal terminals (COMA, COMB, COMC) and/or a plurality of power supply terminals (IOV, IOG) by common wiring, and an insulated circuit (17) that connects the plurality of common signal terminals and/or the plurality of power supply terminals by circuits insulated from each other.

20 Claims, 11 Drawing Sheets

(56) References Cited

FOREIGN PATENT DOCUMENTS

| JP | 2005141719 | 6/2005 |
|----|------------|--------|
| JP | 2007140924 | 6/2007 |
| JP | 2011222019 | 11/2011 |
| JP | 2013162270 | 8/2013 |

OTHER PUBLICATIONS

"Written Opinion of the International Searching Authority (Form PCT/ISA/237) of PCT/JP2020/008702," dated Apr. 7, 2020, with English translation thereof, pp. 1-6.

"Search Report of Europe Counterpart Application", dated Jun. 30, 2023, pp. 1-8.

* cited by examiner

COUNTER UNIT

CROSS-REFERENCE TO RELATED APPLICATION

This application is a 371 application of the International PCT application serial no. PCT/JP2020/008702, filed on Mar. 2, 2020, which claims the priority benefits of Japan Patent Application No. 2019-123659, filed on Jul. 2, 2019. The entirety of each of the above-mentioned patent applications is hereby incorporated by reference herein and made a part of this specification.

TECHNICAL FIELD

The present invention relates to a counter unit that counts input digital pulses.

RELATED ART

In the related art, in a control system, counter units that have a plurality of input channels and are capable of counting count values of multiple channels are known (see, for example, Patent Literature 1). These counter units are mainly the non-insulated input type that inputs pulse signals output from three-phase encoders.

CITATION LIST

Patent Literature

[Patent Literature 1] Japanese Patent Laid-Open No. 2011-222019

SUMMARY OF INVENTION

Technical Problem

The counter unit corresponding to the above-mentioned three-phase encoder output includes three input channels corresponding to three-phase pulse signals. It is conceivable to connect an output device having one output channel such as a flow meter or a linear scale to such a counter unit that has a plurality of input channels. In this case, if a device having one output channel is connected to each of the plurality of input channels without insulating the common signal line between the output devices, the following problems occur. That is, when an electrical trouble occurs in any of the output devices due to noise or a failure of the electric system, the output of other output devices may be affected via the common signal line.

Therefore, the following three methods are taken into consideration for insulating the common signal line between the output devices to connect a plurality of output devices. That is, (1) a method of connecting each output device to each input channel via an isolator, (2) a method of connecting each output device to an individual counter unit, and (3) a method of associating one set of input channels insulated from each other with one output device and using extra input channels. However, these methods have the problems that they cause an increase in cost and an increase in equipment size.

In view of the above, one aspect of the present invention realizes a technique that can support, in a plurality of output devices, both a case where there is no problem in a state in which common signal terminals or power supply terminals are connected by common wiring, and a case where it is preferable to connect the common signal terminals or the power supply terminals by circuits insulated from each other.

Solution to Problem

In view of the above, a counter unit according to one aspect of the present invention includes a plurality of signal input terminals that respectively input pulse signals output from a plurality of output devices that are external; a plurality of common signal terminals that are respectively connected to common signal lines of the plurality of output devices and/or a plurality of power supply terminals that respectively supply power to the plurality of output devices; and a switching unit that switches between a non-insulated circuit that connects the plurality of common signal terminals and/or the plurality of power supply terminals by common wiring, and an insulated circuit that connects the plurality of common signal terminals and/or the plurality of power supply terminals by circuits insulated from each other.

Effects of Invention

According to one aspect of the present invention, it is possible to support, in a plurality of output devices, both a case where there is no problem in a state in which common signal terminals or power supply terminals are connected by common wiring, and a case where it is preferable to connect the common signal terminals or the power supply terminals by circuits insulated from each other.

DESCRIPTION OF EMBODIMENTS

Hereinafter, the embodiment according to one aspect of the present invention (hereinafter, also referred to as "the present embodiment") will be described with reference to the drawings.

1. Application Example
(Overview of Control System)

Figure 1:
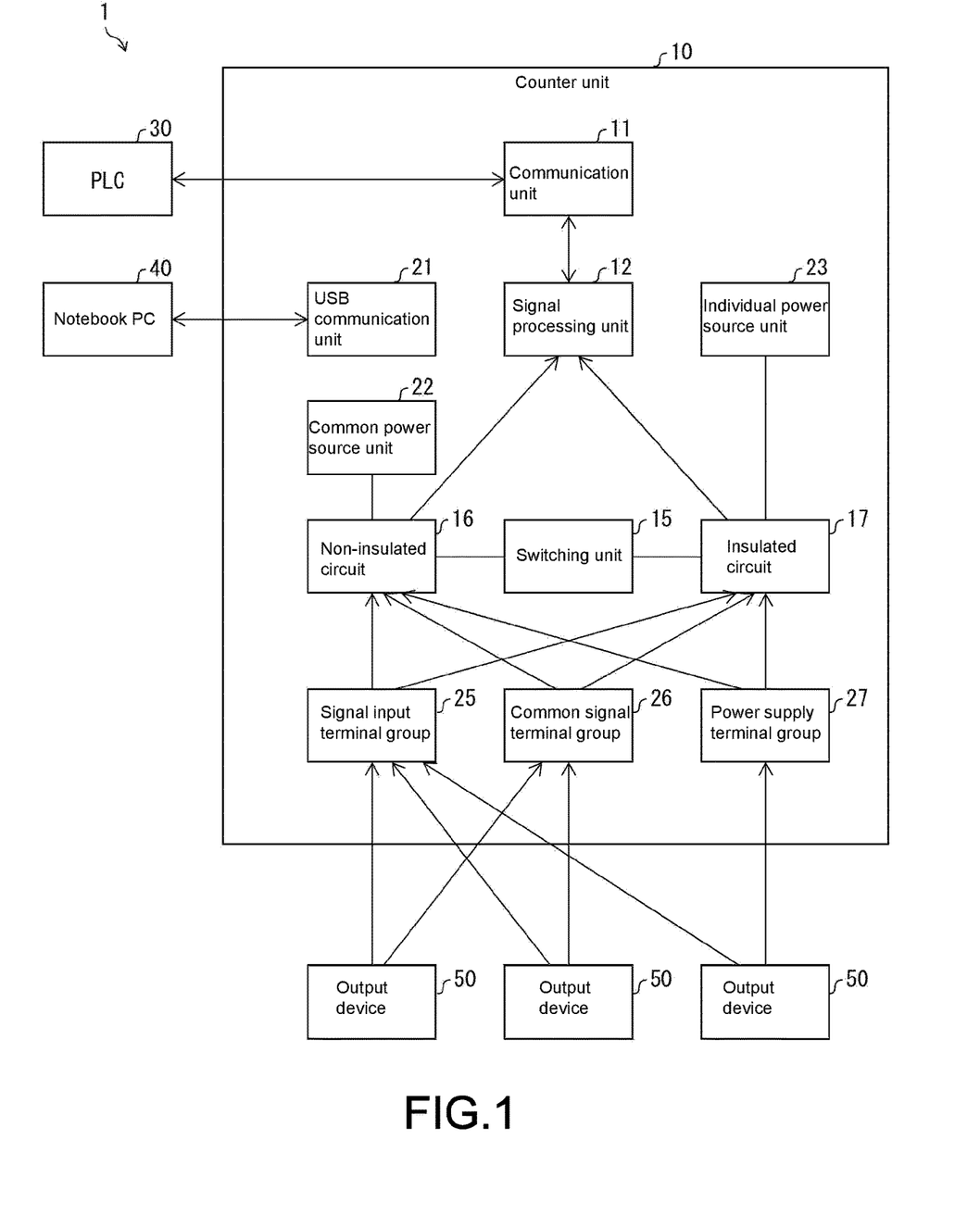
FIG. 1 is a block diagram showing a schematic configuration of a control system in which the counter unit according to the first embodiment of the present invention is used.

FIG. 1 is a block diagram showing a schematic configuration of an entire control system 1 including a counter unit 10. As shown in FIG. 1, the control system 1 includes the counter unit 10 and a PLC (Programmable Logic Controller) 30. The control system 1 further includes a plurality of output devices 50 that output pulse signals. Further, the control system 1 may include a notebook PC 40 as a setting device.

In the control system 1, the counter unit 10 receives the pulse signal generated by the output device 50 as input and uses a count value obtained by counting the number of pulses of the received pulse signal to measure the state of a workpiece, etc. Then, the counter unit 10 transmits information indicated by the count value obtained by counting the pulse signal output by the output device 50 to the PLC 30 for each control cycle of the PLC 30.

The counter unit 10 includes a signal input terminal group 25 having a plurality of signal input terminals A, B, and Z for respectively inputting the pulse signals output from one or a plurality of external output devices 50.

Further, the counter unit 10 includes a common signal terminal group 26 having a plurality of common signal terminals COMA, COMB, and COMC to which one or a plurality of output devices 50 are connected, and a power supply terminal group 27 having a plurality of power supply terminals IOV and IOG for respectively supplying power to one or a plurality of output devices 50.

In addition, the counter unit 10 includes a non-insulated circuit 16 that connects the plurality of common signal terminals COMA, COMB, and COMC and/or the plurality of power supply terminals IOV and IOG by common wiring, and an insulated circuit 17 that connects the plurality of common signal terminals COMA, COMB, and COMC and/or the plurality of power supply terminals IOV and IOG by circuits insulated from each other.

Further, the counter unit 10 includes a switching unit 15 that switches between whether the plurality of common signal terminals COMA, COMB, and COMC and/or the plurality of power supply terminals IOV and IOG are connected to the non-insulated circuit 16 or the insulated circuit 17.

In a case of a configuration where there is no problem in a state in which one or a plurality of output devices 50 connected to the counter unit 10 connect the common signal terminals COMA, COMB, and COMC or the power supply terminals IOV and IOG by common wiring, the counter unit 10 connects the plurality of common signal terminals COMA, COMB, and COMC and/or the plurality of power supply terminals IOV and IOG to the non-insulated circuit 16 by the function of the switching unit 15.

On the other hand, in a case of a configuration where it is preferable for one or a plurality of output devices 50 connected to the counter unit 10 to connect the common signal terminals COMA, COMB, and COMC or the power supply terminals IOV and IOG by circuits insulated from each other, the counter unit 10 connects the plurality of common signal terminals COMA, COMB, and COMC and/or the plurality of power supply terminals IOV and IOG to the insulated circuit 17 by the function of the switching unit 15.

In this way, the counter unit 10 can support both the case where there is no problem in the state in which the common signal terminals COMA, COMB, and COMC or the power supply terminals IOV and IOG are connected by common wiring, and the case where it is preferable to connect the common signal terminals COMA, COMB, and COMC or the power supply terminals IOV and IOG by circuits insulated from each other, according to the configuration of one or a plurality of output devices 50 to be connected.

2. Configuration Example
First Embodiment

The configuration of the counter unit 10 according to the first embodiment will be described in detail below with reference to FIG. 1 to FIG. 5. As shown in FIG. 1, the counter unit 10 is communicably connected to one or a plurality of output devices 50. The output device 50 is an NPN type open collector output type device and, for example, is a three output type encoder that outputs a three-phase pulse signal of phases A, B, and Z, or an encoder, a flow meter, or a linear scale that outputs a single-phase pulse signal as open collector output.

The output device 50 is not limited to the NPN type device, and may be a PNP type open collector output type device. In the following description, the output device 50 that outputs a three-phase pulse signal is also referred to as a three-phase output device 51, and an output device such as a flow meter or a linear scale that outputs a single-phase pulse signal as open collector output is also referred to as a single-phase output device 52. The counter unit 10 receives the pulse signal generated by the output device 50 as input, and uses the count value obtained by counting the number of pulses of the received pulse signal to measure the state of a workpiece, etc.

The counter unit 10 is communicably connected to the PLC 30 via, for example, a field network, and transmits/receives data to/from the PLC 30. The PLC 30 is a control device (controller) that comprehensively controls the entire control system 1. The counter unit 10 transmits/receives data to/from the PLC 30 at a fixed cycle for each control cycle of the PLC 30. For example, the counter unit 10 transmits to the PLC 30 the information indicated by the count value obtained by counting the pulse signal output by the output device 50 for each control cycle of the PLC 30.

Further, the user can change the switching operation in the switching unit 15 of the counter unit 10 by operating a setting program (tool) that operates on the notebook PC 40.

The present embodiment illustrates an example of a configuration in which the notebook PC 40 is connected to the counter unit 10 as an example of the setting device, but the setting device is not limited to the notebook PC 40, and any terminal device including a display unit composed of a liquid crystal panel, etc. and an operation unit composed of a touch panel, a keyboard, a mouse, etc. may be used as the setting device. Further, the PLC 30 may function as the setting device, and may have a configuration that transmits an instruction for changing the switching operation in the switching unit 15 from the PLC 30 to the counter unit 10.

(Regarding the Configuration of the Counter Unit 10)

The counter unit 10 includes a communication unit 11, a signal processing unit 12, a signal input terminal group 25, a common signal terminal group 26, and a power supply terminal group 27. Further, the counter unit 10 includes a switching unit 15, a non-insulated circuit 16, an insulated circuit 17, a common power source unit 22, and an individual power source unit 23. Furthermore, the counter unit 10 includes a USB communication unit 21.

The communication unit 11 repeats for every control cycle of the PLC 30 to communicate with the PLC 30 and execute data transmission/reception. The communication unit 11 is realized by using, for example, an integrated circuit such as communication IC (Integrated Circuits).

The counter unit 10 and the PLC 30 may be connected to each other so as to be capable of communicating with each other via, for example, a field network. As the field network connecting the counter unit 10 and the PLC 30, typically various types of Industrial Ethernet (registered trademark) can be used. EtherCAT (registered trademark), Profinet IRT, MECHATROLINK®-III, Powerlink, SERCOS®-III, CIP Motion, etc. are known as examples of Industrial Ethernet (registered trademark), and any of these may be adopted. Further, a field network other than Industrial Ethernet (registered trademark) may be used. For example, if motion control is not performed, DeviceNet, CompoNet/IP (registered trademark), etc. may be used.

Further, the counter unit 10 may be integrally formed with the PLC 30, or may be communicably connected to the PLC 30 via an internal bus.

The signal processing unit 12 processes the pulse signals output as open collector output by one or a plurality of output devices 50. The signal processing unit 12 counts the number of pulses of the pulse signal output by the output device 50 according to a preset set value, and uses the count value to measure the state of a workpiece, etc. The measurement result of the signal processing unit 12 is transmitted to the PLC 30 via the communication unit 11 at an output timing adjusted according to the set value.

The signal processing unit 12 is realized by software using, for example, a CPU (Central Processing Unit) or an MPU (Micro Processor Unit). Further, the signal processing unit 12 may be realized by hardware using, for example, a counter function inside the MPU, or may be realized by using an IC such as FPGA or ASIC.

The signal input terminal group 25 includes a plurality of signal input terminals for respectively inputting the pulse signals output from one or a plurality of output devices 50. The signal input terminal group 25 is provided with at least three signal input terminals A, B, and Z.

The common signal terminal group 26 includes a plurality of common signal terminals respectively connected to common signal lines of one or a plurality of output devices 50. The common signal terminal group 26 is provided with at least three common signal terminals COMA, COMB, and COMC.

The power supply terminal group 27 includes a plurality of power supply terminals IOV and IOG for respectively supplying power to one or a plurality of output devices 50. The power supply terminal group 27 is provided with at least a pair of power supply terminals IOV and IOG.

The common power source unit 22 supplies power to the non-insulated circuit 16. The common power source unit 22 can supply power to a plurality of output devices 50 respectively connected to the plurality of power supply terminals IOV and IOG via the non-insulated circuit 16.

The individual power source unit 23 is provided in each of the insulated circuits 17 that are insulated from each other. Each individual power source unit 23 supplies power to the corresponding insulated circuit 17. Each individual power source unit 23 supplies power to the output device 50 via the corresponding insulated circuit 17.

The non-insulated circuit 16 and the insulated circuit 17 are provided so that each of the plurality of signal input terminals A, B, and Z, the plurality of common signal terminals COMA, COMB, and COMC, and the plurality of power supply terminals IOV and IOG can be connected.

The switching unit 15 switches the connection of at least one of the plurality of common signal terminals COMA, COMB, and COMC and the plurality of power supply terminals IOV and IOG between the non-insulated circuit 16 and the insulated circuit 17. The switching unit 15 includes, for example, a hardware switch such as a relay switch or a switching IC, and by switching the hardware switch, switches the connection of wiring between the non-insulated circuit 16 and the insulated circuit 17. Further, as described above, the switching unit 15 switches the hardware switch based on an instruction of the setting program operating on the notebook PC 40.

The USB communication unit 21 has a USB port and communicates with the notebook PC 40 via a USB cable connected to the USB port. The USB communication unit 21 receives a signal indicating the instruction of the setting program that operates on the notebook PC 40. The signal received by the USB communication unit 21 and indicating the instruction of the setting program operating on the notebook PC 40 includes the instruction of the switching operation of the switching unit 15, and the USB communication unit 21 functions as a switching reception unit that receives the instruction of the switching operation via a communication line.

In this way, the counter unit 10 receives the instruction of the switching operation of the switching unit 15 from the notebook PC 40 via the USB communication unit 21, and in response to the instruction, the switching unit 15 switches between the non-insulated circuit 16 and the insulated circuit 17. Therefore, it is possible to control the switching operation between the non-insulated circuit 16 and the insulated circuit 17 performed by the switching unit 15 from the outside of the counter unit 10 via the communication line.

(Connection to Non-Insulated Circuit)

Figure 2:
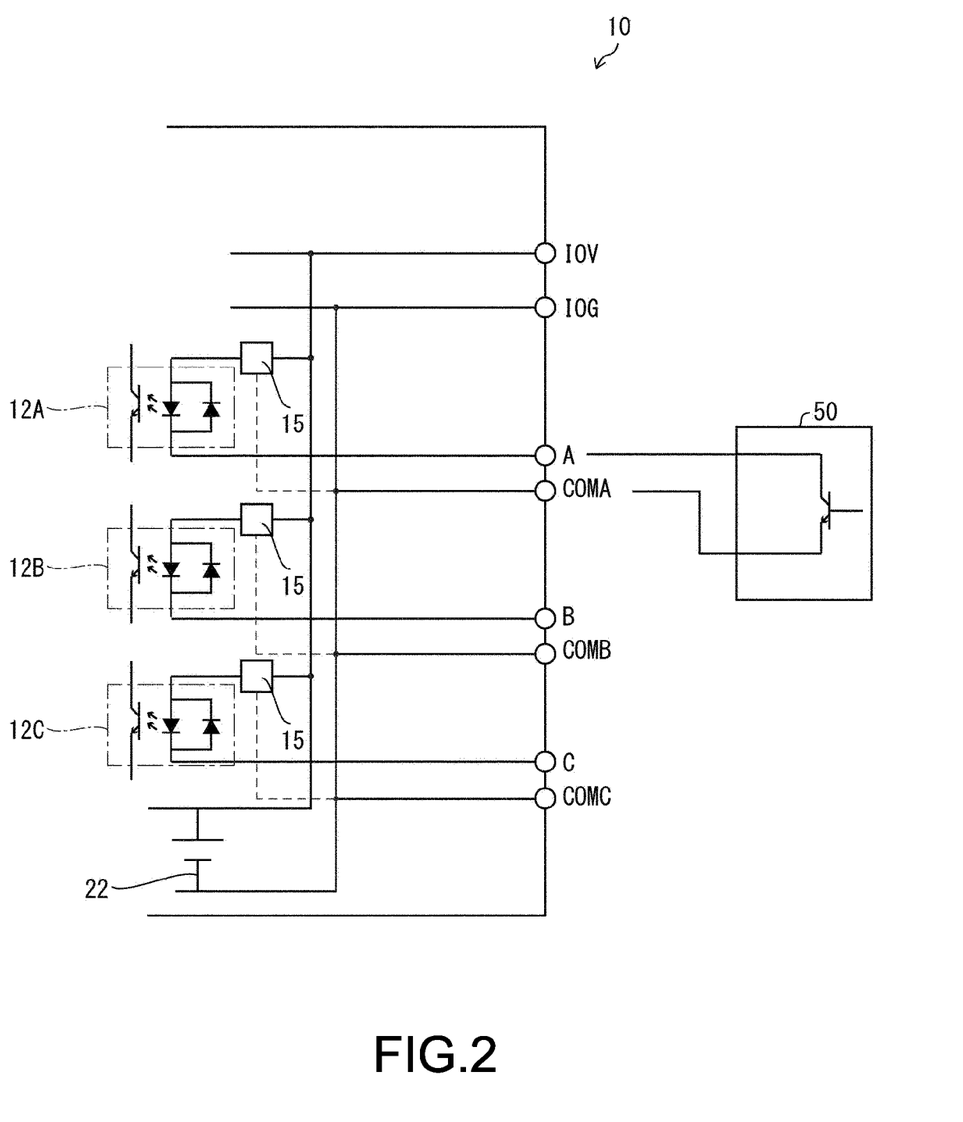
FIG. 2 is a wiring connection diagram in a non-insulated mode of the counter unit according to the first embodiment.
Figure 3:
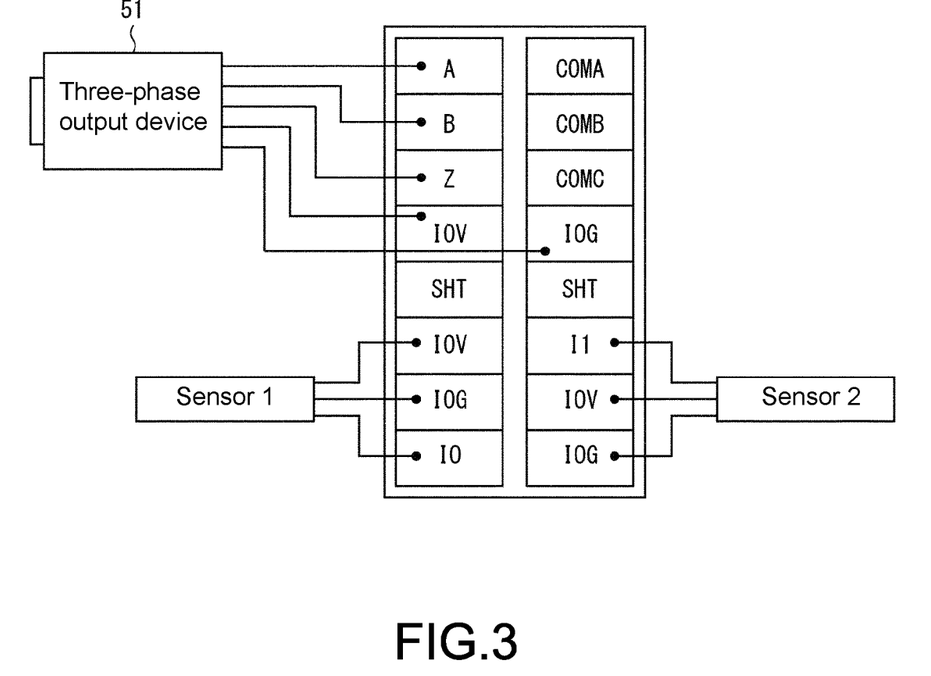
FIG. 3 is a diagram schematically showing a state of wiring connection in the non-insulated mode of the counter unit according to the first embodiment.

FIG. 2 and FIG. 3 are diagrams showing the connection state of wiring in a non-insulated mode using the non-insulated circuit 16 which connects the plurality of common signal terminals COMA, COMB, and COMC and the plurality of power supply terminals IOV and IOG by common wiring by the function of the switching unit 15. As shown in FIG. 2 and FIG. 3, when a three-phase output device 51 is connected and used, the counter unit 10 is used in the non-insulated mode.

In non-insulated mode, the plurality of common signal terminals COMA, COMB, and COMC and the plurality of power supply terminals IOV and IOG of the counter unit 10 are connected to the non-insulated circuit 16 by the switching unit 15. The non-insulated circuit 16 connects signal processing input units 12A, 12B, and 12C, which are input units to the signal processing unit 12, to the plurality of common signal terminals COMA, COMB, and COMC by common connection lines, and also connects the plurality of power supply terminals IOV and IOG to the common power source unit 22. The signal processing input units (open collector signal processing units) 12A, 12B, and 12C process the pulse signal output as open collector output by the output device 50 and transmit it to the signal processing unit 12.

The plurality of signal input terminals A, B, and Z to which the signal from the output device 50 is input are respectively connected to the signal processing input units 12A, 12B, and 12C. The potentials of the power supply terminals IOV and IOG are shared among the plurality of common signal terminals COMA, COMB, and COMC via the non-insulated circuit 16.

As shown in FIG. 3, the three-phase signal lines from the three-phase output device 51 are respectively connected to the signal input terminals A, B, and Z of the counter unit 10, and the power source line from the three-phase output device 51 is respectively connected to the power supply terminals IOV and IOG of the counter unit 10. In the example shown in FIG. 3 (and FIG. 5 and FIG. 8 described later), an example is shown in which the counter unit 10 also includes a sensor input terminal for inputting the output from a sensor and a sensor power supply terminal for supplying power to the sensor.

(Connection to Insulated Circuit)

Figure 4:
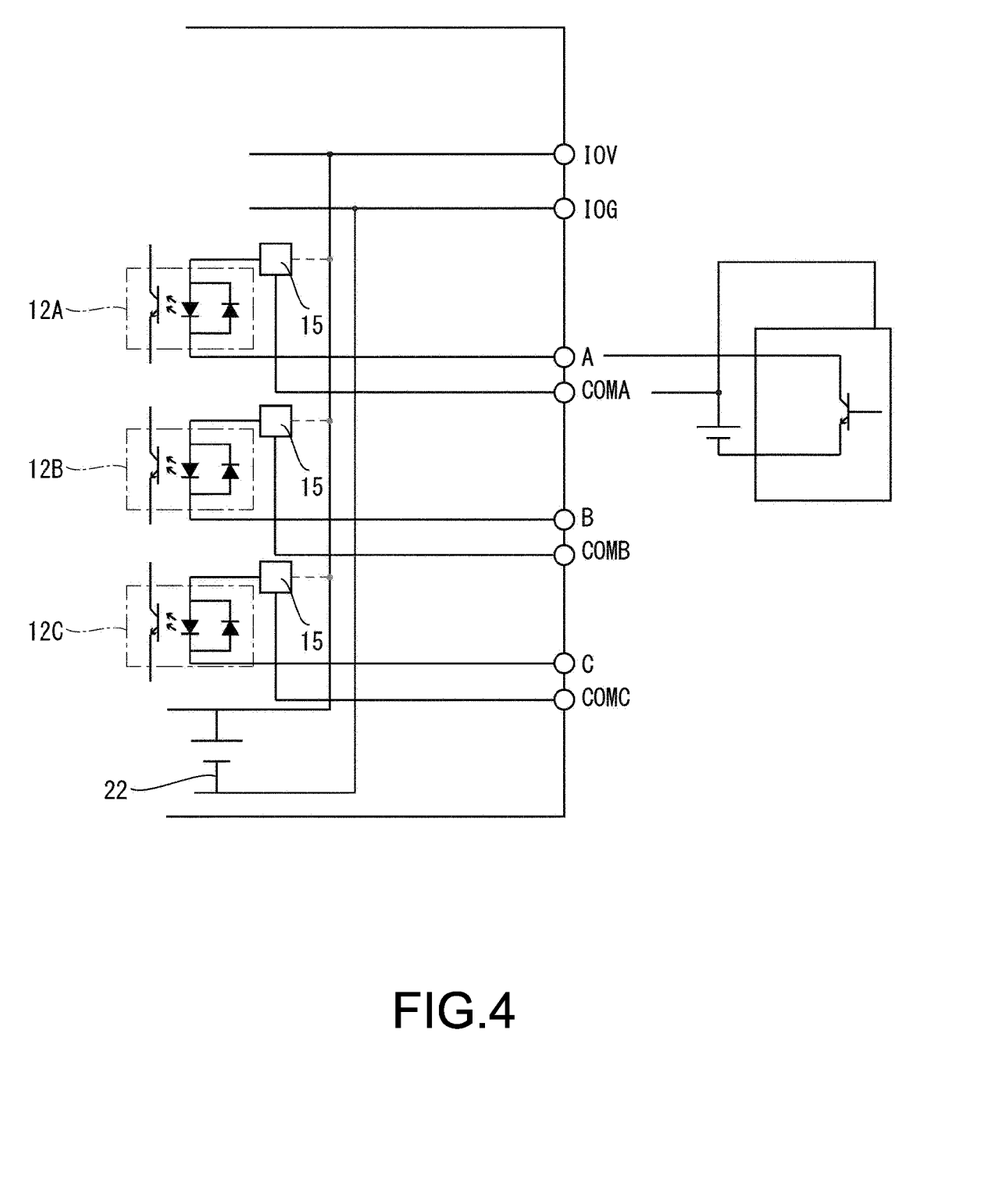
FIG. 4 is a wiring connection diagram in an insulated mode of the counter unit according to the first embodiment.
Figure 5:
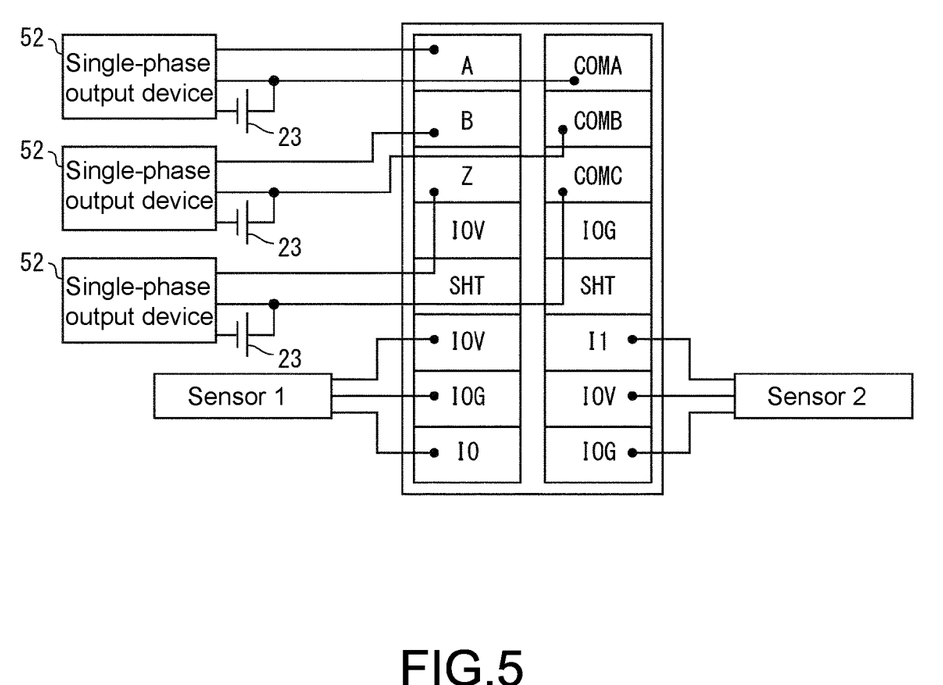
FIG. 5 is a diagram schematically showing a state of wiring connection in the insulated mode of the counter unit according to the first embodiment.

FIG. 4 and FIG. 5 are diagrams showing the connection state of wiring in an insulated mode using the insulated circuit 17 which connects the plurality of common signal terminals COMA, COMB, and COMC by insulating them from each other and connects each common signal terminal COMA, COMB, and COMC and the power supply terminals IOV and IOG by circuits insulated from each other by the function of the switching unit 15. As shown in FIG. 4 and FIG. 5, when a plurality of single-phase output devices 52 are connected and used, the counter unit 10 is used in the insulated mode.

In the insulated mode, the plurality of common signal terminals COMA, COMB, and COMC and the plurality of power supply terminals IOV and IOG of the counter unit 10 are connected to the insulated circuit 17 by the switching unit 15. The insulated circuit 17 respectively connects the signal processing input units 12A, 12B, and 12C to the plurality of common signal terminals COMA, COMB, and COMC aby circuits insulated from each other, and connects the plurality of power supply terminals IOV and IOG to the individual power source units 23 by circuits insulated from each other.

Further, the plurality of signal input terminals A, B, and Z are respectively connected to the signal processing input units 12A, 12B, and 12C.

As shown in FIG. 5, the individual power source units 23 are respectively connected between the common signal terminals of the single-phase output devices 52 and the plurality of common signal terminals COMA, COMB, and COMC of the counter unit 10. The individual power source unit 23 may be provided outside the counter unit 10. By providing the individual power source unit 23 outside the counter unit 10, it is possible to provide a counter unit 10 that can be used by switching between the non-insulated mode and the insulated mode without increasing the size of the counter unit 10.

According to these configurations, the counter unit 10 can be used by switching between a case where the counter unit 10 is used in the non-insulated mode and a case where the counter unit 10 is used in the insulated mode. Therefore, the counter unit 10 is capable of supporting both a case where one three-phase output device 51 that outputs the three-phase pulse signal of phases A, B, and Z is connected to the counter unit 10 for use, and a case where one to three single-phase output devices 52 that output the single-phase pulse signal as open collector output are connected to the counter unit 10 for use.

Further, in the non-insulated mode in which the power supply terminals IOV and IOG are connected by common wiring, it is possible to supply power from the common power source unit 22 from the side of the counter unit 10 to a plurality of output devices 50. Therefore, it is possible to eliminate the need to separately prepare a member for supplying power to the side of the output devices 50.

Further, when the counter unit 10 is used in the insulated mode, the potential is not shared among the common signal terminals COMA, COMB, and COMC. Therefore, it is possible to prevent the influence of noise from the output device 50 from being shared among the common signal terminals COMA, COMB, and COMC without the intervention of an external device such as an isolator.

Second Embodiment

The second embodiment of the present invention will be described below. For convenience of explanation, the same reference numerals will be added to members having the same functions as the members described in the first embodiment, and the description thereof will not be repeated. Further, since the configuration of the entire control system 1 is the same as the configuration described in the first embodiment using the block diagram of FIG. 1, the description thereof will be omitted.

In the counter unit 10 according to the second embodiment, individual power source units 23 respectively provided in the insulated circuits 17 insulated from each other are provided inside the counter unit 10.

Figure 6:
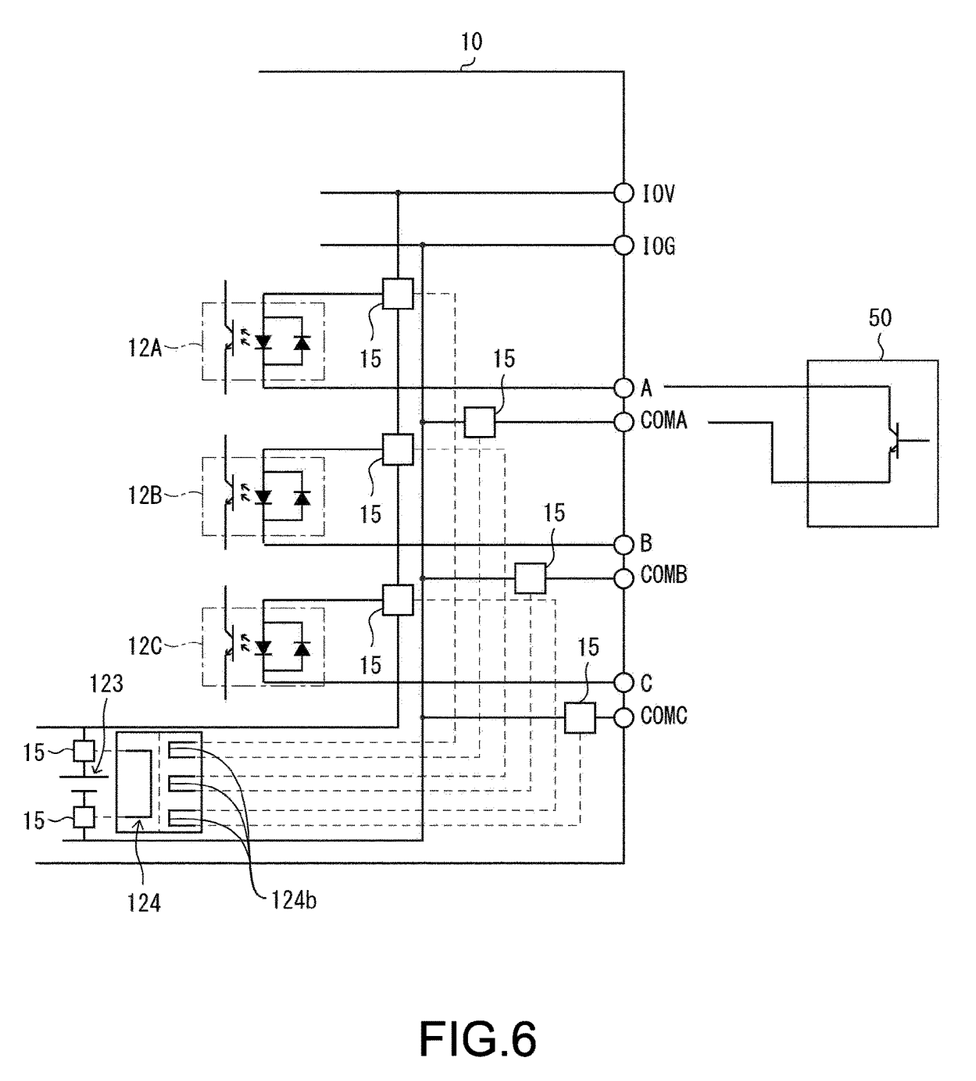
FIG. 6 is a wiring connection diagram in a non-insulated mode of the counter unit according to the second embodiment.
Figure 7:
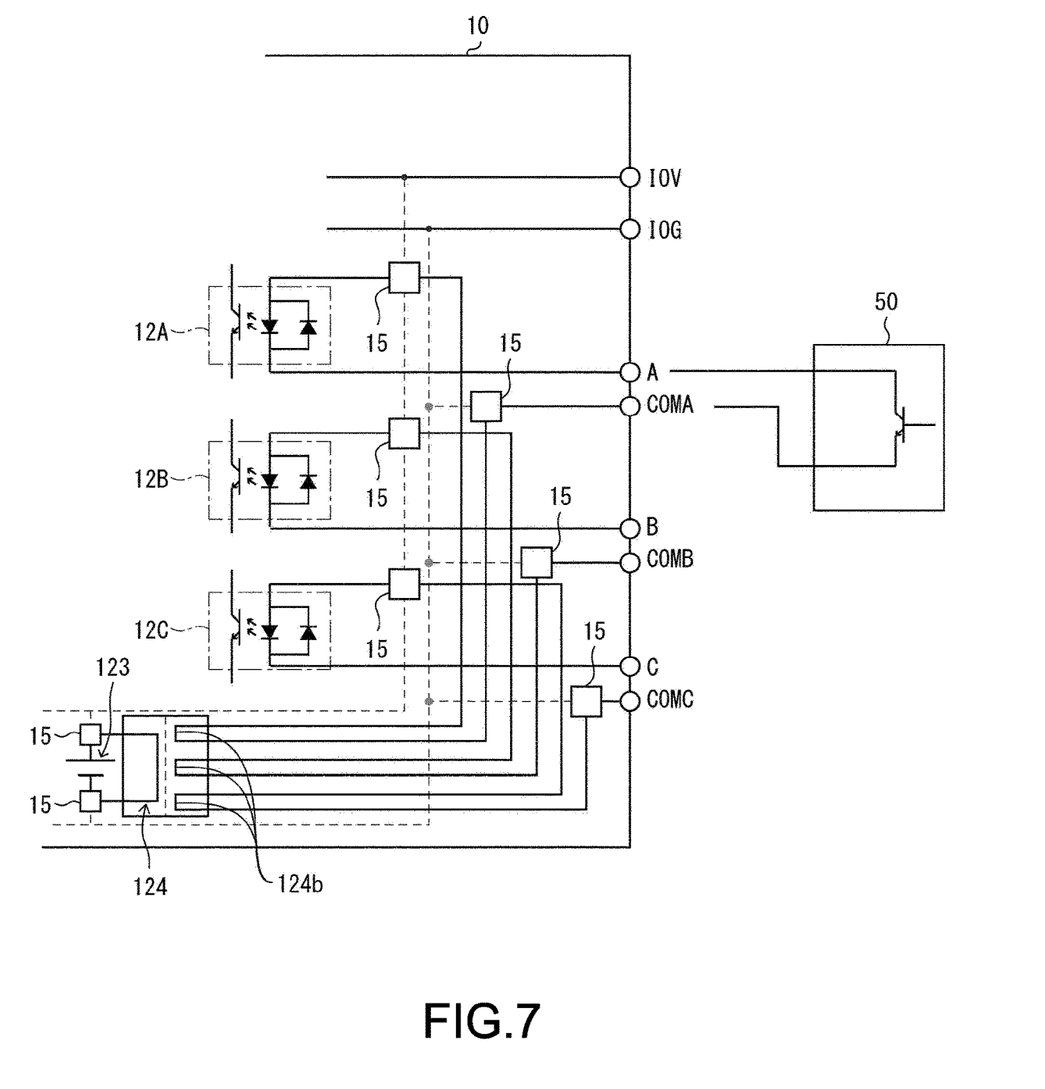
FIG. 7 is a wiring connection diagram in an insulated mode of the counter unit according to the second embodiment.
Figure 8:
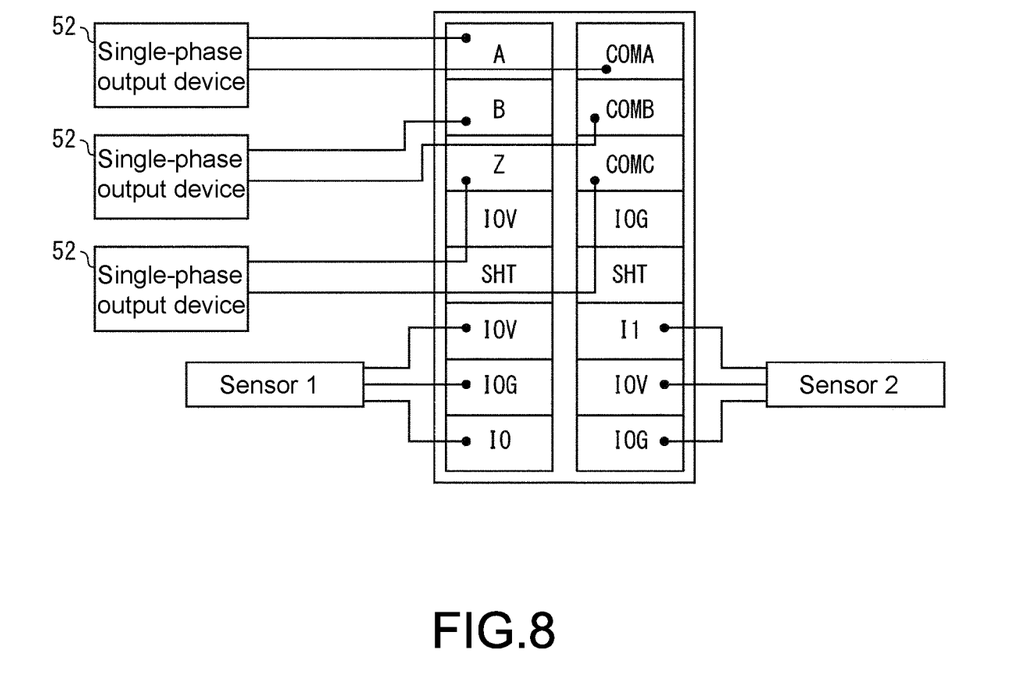
FIG. 8 is a diagram schematically showing a state of wiring connection in the insulated mode of the counter unit according to the second embodiment.

FIG. 6 is a diagram showing the connection state of wiring of the counter unit 10 in the non-insulated mode, and FIG. 7 is a diagram showing the connection state of wiring of the counter unit 10 in the insulated mode. FIG. 8 is a diagram schematically showing the wiring state when a plurality of single-phase output devices 52 are connected to the counter unit 10 in the insulated mode.

As shown in FIG. 6 and FIG. 7, the counter unit 10 includes a power source unit 123. The power source unit 123 includes an insulated power source circuit 124. The power source unit 123 can switch between supplying power to the non-insulated circuit 16 and supplying power to the insulated circuit 17 via the insulated power source circuit 124. That is, the power source unit 123 functions as a common power source unit in the non-insulated mode, and functions as an individual power source unit together with the insulated power source circuit 124 in the insulated mode.

The insulated power source circuit 124 is a circuit that converts the power from the power source unit 123 into three system outputs that are insulated from each other. These three system outputs are referred to as the insulated power source output units 124*b*.

In the non-insulated mode shown in FIG. 6, the plurality of common signal terminals COMA, COMB, and COMC and the plurality of power supply terminals IOV and IOG of the counter unit 10 are connected to the non-insulated circuit 16 by the switching unit 15. The non-insulated circuit 16 connects the signal processing input units 12A, 12B, and 12C, which are input units to the signal processing unit 12, to the plurality of common signal terminals COMA, COMB, and COMC by a common connection line, and also connects the plurality of power supply terminals IOV and IOG to the power source unit 123.

Each of the plurality of signal input terminals A, B, and Z to which the signal from the output device 50 is input is connected to the signal processing input units 12A, 12B, and 12C. The potentials of the power supply terminals IOV and IOG are shared among the plurality of common signal terminals COMA, COMB, and COMC via the non-insulated circuit 16.

In the insulated mode shown in FIG. 7, the plurality of common signal terminals COMA, COMB, and COMC of the counter unit 10 are connected to the insulated circuit 17 by the switching unit 15. The insulated circuit 17 respectively connects the plurality of common signal terminals COMA, COMB, and COMC to the insulated power source output unit 124*b* by circuits insulated from each other, and respectively connects the signal processing input units 12A, 12B, and 12C to the insulated power source output unit 124*b* by circuits insulated from each other.

In this way, the power source unit 123 provided inside the counter unit 10 can supply power to the non-insulated circuit in the non-insulated mode, and supply power individually to each of the insulated circuits 17 that are insulated from each other in the insulated mode. Therefore, as shown in FIG. 8, the counter unit 10 does not need to separately prepare a member for power supply on the side of the output device 50, and a plurality of output devices 50 can be used by being connected to the insulated circuits 17 insulated from each other. Therefore, it is possible to provide a counter unit 10 that can support both the non-insulated mode and the insulated mode without using an external power source.

Third Embodiment

The third embodiment of the present invention will be described below. For convenience of explanation, the same reference numerals will be added to members having the same functions as the members described in the first embodiment, and the description thereof will not be repeated. Further, since the configuration of the entire control system 1 is the same as the configuration described in the first embodiment using the block diagram of FIG. 1, the description thereof will be omitted.

Figure 9:
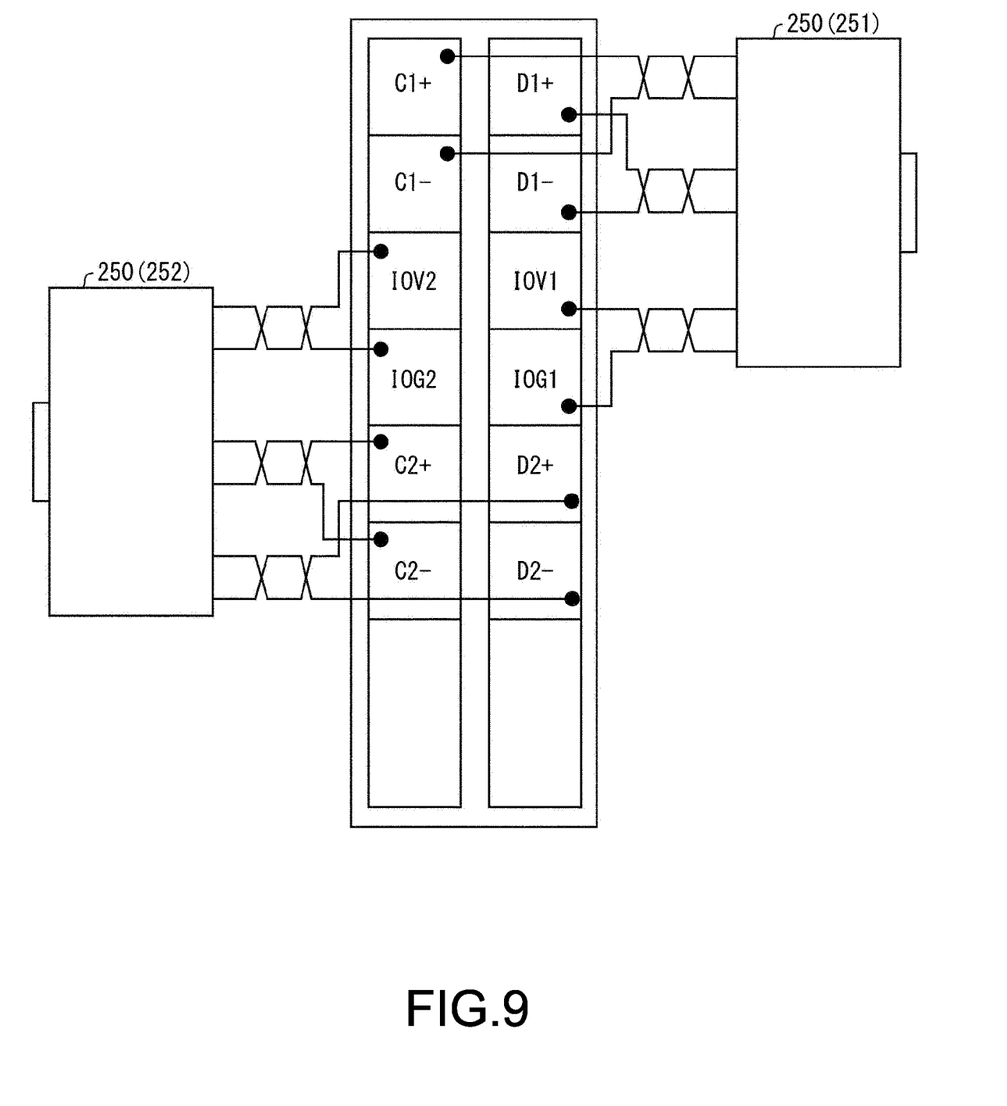
FIG. 9 is a diagram schematically showing a state of wiring connection of the counter unit according to the third embodiment.
Figure 10:
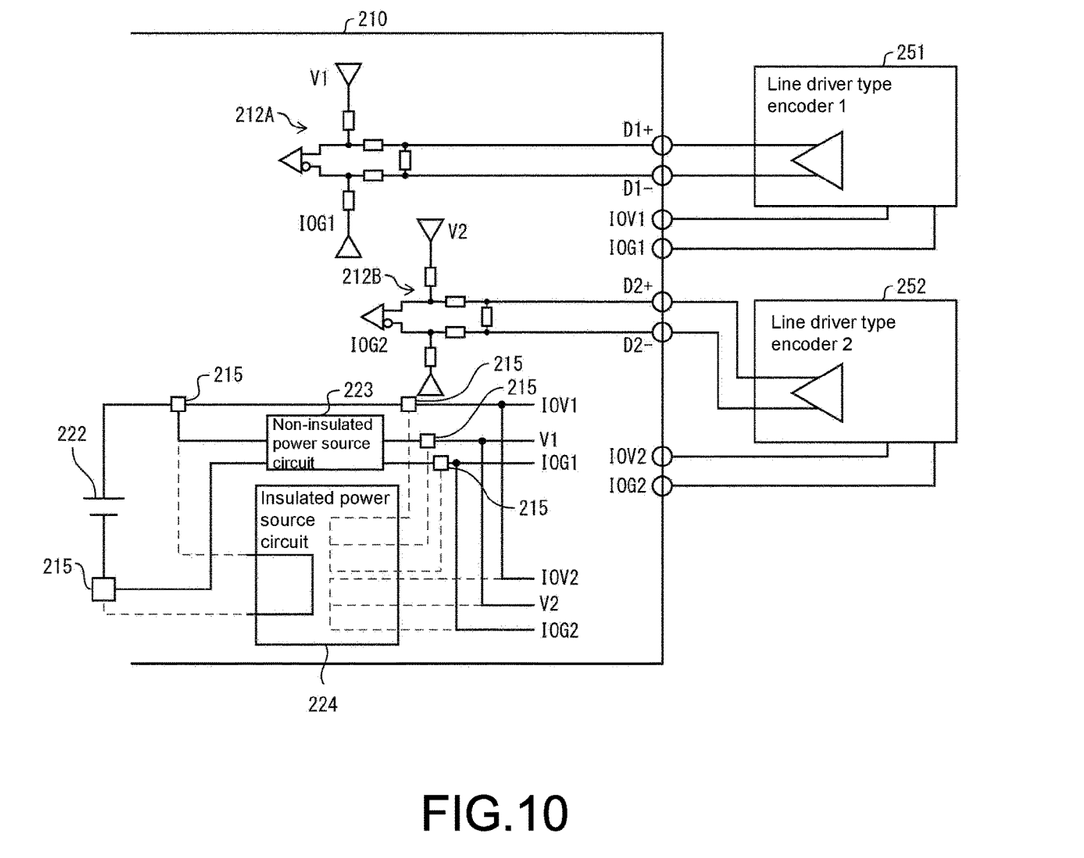
FIG. 10 is a wiring connection diagram in a non-insulated mode of the counter unit according to the third embodiment.
Figure 11:
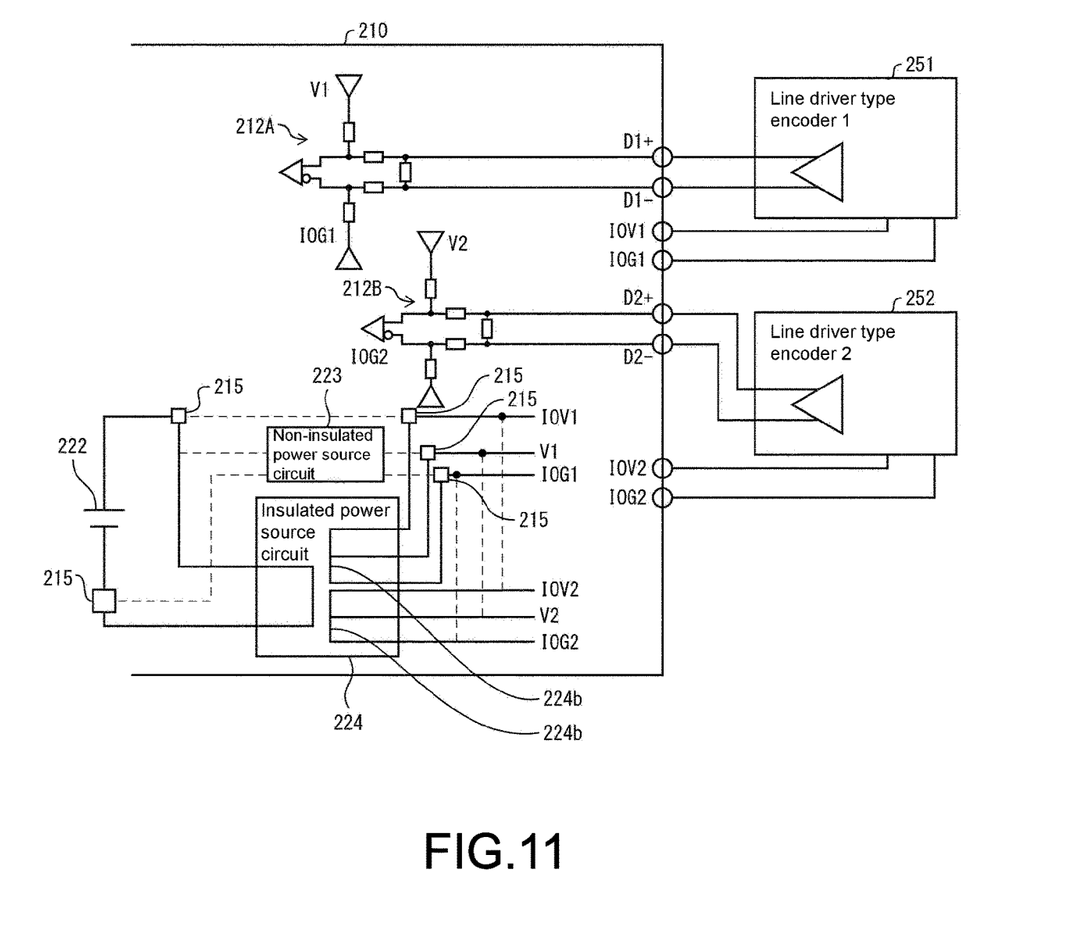
FIG. 11 is a wiring connection diagram in an insulated mode of the counter unit according to the third embodiment.

FIG. 10 is a diagram showing the connection state of wiring in the non-insulated mode of the counter unit 210 according to the third embodiment. FIG. 11 is a diagram showing the connection state of wiring of the counter unit 210 in the insulated mode. The counter unit 210 shown in FIG. 10 and FIG. 11 is a single-phase line driver input type counter unit corresponding to a line driver output type output device 250. The counter unit 210 is not limited to a configuration corresponding to single-phase input, and may have a configuration corresponding to two-phase input. FIG. 9 is a diagram schematically showing the wiring state when a plurality of line driver output type output devices 250 are connected to the counter unit 210 corresponding to two-phase input.

As shown in FIG. 10 and FIG. 11, a plurality of output devices 250 are connected to the counter unit 210. The output device 250 is, for example, a line driver output type encoder, and in the example shown in FIG. 10 and FIG. 11, two encoders 251 and 252 are connected to the counter unit 210.

The counter unit 210 includes a pair of power supply terminals IOV1 and IOG1 to which the encoder 251 is connected, and a pair of power supply terminals IOV2 and IOG2 to which the encoder 252 is connected. In addition, the counter unit 210 includes signal input terminals D1⁺ and D1⁻ to which the signal line from the encoder 251 is connected, and signal input terminals D2⁺ and D2⁻ to which the signal line from the encoder 252 is connected. The counter unit 210 receives a single-phase pulse signal from each of the signal input terminals D1⁺ and D1⁻ and the signal input terminals D2⁺ and D2⁻.

Signals having inverted polarities are input to the signal input terminal D1⁺ and the signal input terminal D1⁻. Further, signals having inverted polarities are input to the signal input terminal D2⁺ and the signal input terminal D2⁻.

In the counter unit 210, the signal processing unit 12 processes the difference between the signal input terminals D2⁺ and D2⁻ as a signal from the encoder 252.

The counter unit 210 is connected so that the power source unit 222 can be switched between the non-insulated power source circuit 223 and the insulated power source circuit 224. Further, the counter unit 210 includes a switching unit 215 that switches between connecting the power source unit 222 to the non-insulated power source circuit 223 and supplying power to the power supply terminals IOV and IOG via the non-insulated power source circuit 223, and connecting the power source unit 222 to the insulated power source circuit 224 and supplying power to the power supply terminals IOV and IOG via the insulated power source circuit 224. That is, the power source unit 222 functions as a common power source unit together with the non-insulated power source circuit 223 in the non-insulated mode, and functions as an individual power source unit together with the insulated power source circuit 224 in the insulated mode.

The insulated power source circuit 224 is a circuit that converts the power from the power source unit 222 into two system outputs that are insulated from each other. These two system outputs are referred to as an insulated power source output unit 224b.

In the non-insulated mode shown in FIG. 10, the plurality of power supply terminals IOV and IOG of the counter unit 210 are connected to the non-insulated power source circuit 223 by the switching unit 215. The non-insulated power source circuit 223 connects the plurality of power supply terminals IOV and IOG to the power source unit 222 by a common connection line.

Each of the plurality of signal input terminals D⁺ and D⁻ to which the signal from the output device 50 is input is connected to the signal processing input units (line driver signal processing units) 212A and 212B, which are input units for the signal processing unit 12. The signal processing input units 212A and 212B process the pulse signal output as line driver output by the output device 250 and transmit it to the signal processing unit 12.

In the insulated mode shown in FIG. 11, the plurality of power supply terminals IOV and IOG of the counter unit 210 are connected to the insulated power source circuit 224 by the switching unit 215. The insulated power source circuit 224 connects each of the plurality of power supply terminals IOV and IOG to the power source unit 222 by circuits insulated from each other.

In this way, the power source unit 222 provided inside the counter unit 210 can supply power to the non-insulated power source circuit 223 in the non-insulated mode, and supply power individually to each of the plurality of insulated power source output units 224b, insulated from each other, of the insulated power source circuit 224 in the insulated mode. Therefore, the counter unit 210 does not need to separately prepare a member for power supply on the side of the output device 250, and a plurality of line driver input type output devices 250 can be used by being connected to the insulated power source circuit 224 insulated from each other. Therefore, it is possible to provide a counter unit 210 that can support both the non-insulated mode and the insulated mode without using an external power source.

As shown in FIG. 9, the counter unit 210 may be a line driver input type unit corresponding to two-phase input. Further, the counter unit 210 may be configured to correspond to two-phase input and to be capable of connecting a plurality of output devices 251 and 252.

For example, the counter unit 210 includes signal input terminals C1⁺ and C1⁻ to which the signal line of one phase from one encoder 251 is connected, and signal input terminals D1⁺ and D1⁻ to which the signal line of the other phase from the encoder 251 is connected. Further, the counter unit 210 includes signal input terminals C2⁺ and C2⁻ to which the signal line of one phase from the other encoder 252 is connected, and signal input terminals D2⁺ and D2⁻ to which the signal line of the other phase from the encoder 252 is connected.

In the non-insulated mode, the power supply terminals IOV1 and IOG1 and the power supply terminals IOV2 and IOG2 are connected to the non-insulated power source circuit 223. On the other hand, in the insulated mode, the power supply terminals IOV1 and IOG1 and the power supply terminals IOV2 and IOG2 are connected to the insulated power source circuit 224 in a state of being insulated from each other.

In this way, similar to the counter unit corresponding to single-phase input, the line driver input type counter unit 210 corresponding to two-phase input can use a plurality of output devices 250 by connecting to the insulated power source circuit 224 insulated from each other, and can support both the non-insulated mode and the insulated mode without using an external power source.

(Summary)

A counter unit according to one aspect of the present invention includes a plurality of signal input terminals that respectively input pulse signals output from a plurality of output devices that are external; a plurality of common signal terminals that are respectively connected to common signal lines of the plurality of output devices and/or a plurality of power supply terminals that respectively supply power to the plurality of output devices; and a switching unit that switches between a non-insulated circuit that connects the plurality of common signal terminals and/or the plurality of power supply terminals by common wiring, and an insulated circuit that connects the plurality of common signal terminals and/or the plurality of power supply terminals by circuits insulated from each other.

According to the above configuration, it is possible to support, in a plurality of output devices, both a case where there is no problem in a state in which the common signal terminals or the power supply terminals are connected by common wiring, and a case where it is preferable to connect the common signal terminals or the power supply terminals by circuits insulated from each other. Therefore, it is possible to eliminate the need to use extra channels, prepare a plurality of counter units according to the application, and intervene an isolator when insulation is required between a plurality of output devices.

The counter unit according to one aspect of the present invention may further include a common power source unit that supplies power to the non-insulated circuit.

According to the above configuration, when there is no problem in the state where the common signal terminals or the power supply terminals are connected by common wiring in a plurality of output devices, it is possible to supply power to a plurality of output devices from the counter unit side. Therefore, it is possible to eliminate the need to separately prepare a member for power supply on the output device side.

In the counter unit according to one aspect of the present invention, the insulated circuit may be respectively provided with an individual power source unit that supplies power to the insulated circuit.

According to the above configuration, when it is preferable to connect by circuits insulated from each other in a plurality of output devices, it is possible to supply power to a plurality of output devices from the counter unit side. Therefore, it is possible to eliminate the need to separately prepare a member for power supply on the output device side.

In the counter unit according to one aspect of the present invention, the switching unit may be a relay switch or a switching IC.

According to the above configuration, since the non-insulated circuit and the insulated circuit can be switched by a hardware switch such as a relay switch or a switching IC, it is possible to ensure that they are insulated from each other.

The counter unit according to one aspect of the present invention may further include an open collector signal processing unit that processes the pulse signal output as open collector output by the output device.

In the counter unit according to one aspect of the present invention, at least three signal input terminals may be provided, at least three common signal terminals may be provided, and at least one pair of power supply terminals may be provided.

According to the above configuration, when connecting a three-output type encoder that outputs a pulse signal of phases A, B, and Z, it is possible to support a case where one to three encoders that output a single-phase pulse signal as open collector output are connected.

The counter unit according to one aspect of the present invention may further include a line driver signal processing unit that processes the pulse signal output as line driver output by the output device.

The counter unit according to one aspect of the present invention further includes a switching reception unit that receives an instruction of a switching operation of the switching unit via a communication line.

According to the above configuration, it is possible to control the switching operation from the outside via the communication line.

The present invention is not limited to the above-described respective embodiments, and various modifications can be made within the scope of the claims, and the embodiments obtained by appropriately combining the technical means disclosed in the different embodiments are also included in the technical scope of the present invention.

What is claimed is:

1. A counter unit, comprising:
   a plurality of signal input terminals that respectively input pulse signals output from a plurality of output devices that are external;
   a plurality of common signal terminals that are respectively connected to common signal lines of the plurality of output devices and/or a plurality of power supply terminals that respectively supply power to the plurality of output devices; and
   a switching unit that switches between a non-insulated circuit that connects the plurality of common signal terminals and/or the plurality of power supply terminals by common wiring, and an insulated circuit that connects the plurality of common signal terminals and/or the plurality of power supply terminals by circuits insulated from each other.

2. The counter unit according to claim 1, further comprising a common power source unit that supplies power to the non-insulated circuit.

3. The counter unit according to claim 2, wherein the insulated circuit is respectively provided with an individual power source unit that supplies power to the insulated circuit.

4. The counter unit according to claim 2, wherein the switching unit is a relay switch or a switching IC.

5. The counter unit according to claim 2, further comprising an open collector signal processing unit that processes the pulse signal output as open collector output by the output device.

6. The counter unit according to claim 2, wherein at least three signal input terminals are provided,
at least three common signal terminals are provided, and
at least one pair of power supply terminals are provided.

7. The counter unit according to claim 2, further comprising a line driver signal processing unit that processes the pulse signal output as line driver output by the output device.

8. The counter unit according to claim 1, wherein the insulated circuit is respectively provided with an individual power source unit that supplies power to the insulated circuit.

9. The counter unit according to claim 8, wherein the switching unit is a relay switch or a switching IC.

10. The counter unit according to claim 8, further comprising an open collector signal processing unit that processes the pulse signal output as open collector output by the output device.

11. The counter unit according to claim 8, wherein at least three signal input terminals are provided,
at least three common signal terminals are provided, and
at least one pair of power supply terminals are provided.

12. The counter unit according to claim 8, further comprising a line driver signal processing unit that processes the pulse signal output as line driver output by the output device.

13. The counter unit according to claim 1, wherein the switching unit is a relay switch or a switching IC.

14. The counter unit according to claim 13, further comprising an open collector signal processing unit that processes the pulse signal output as open collector output by the output device.

15. The counter unit according to claim 13, wherein at least three signal input terminals are provided,
at least three common signal terminals are provided, and
at least one pair of power supply terminals are provided.

16. The counter unit according to claim 14, further comprising an open collector signal processing unit that processes the pulse signal output as open collector output by the output device.

17. The counter unit according to claim 16, wherein at least three signal input terminals are provided,
at least three common signal terminals are provided, and
at least one pair of power supply terminals are provided.

18. The counter unit according to claim 1, wherein at least three signal input terminals are provided,
at least three common signal terminals are provided, and
at least one pair of power supply terminals are provided.

19. The counter unit according to claim 1, further comprising a line driver signal processing unit that processes the pulse signal output as line driver output by the output device.

20. The counter unit according to claim 1, further comprising a switching reception unit that receives an instruction of a switching operation of the switching unit via a communication line.

* * * * *